United States Patent [19]

Blaes et al.

[11] Patent Number: 4,688,947
[45] Date of Patent: Aug. 25, 1987

[54] METHOD AND APPARATUS FOR CHARACTERIZING PROPAGATION DELAYS OF INTEGRATED CIRCUIT DEVICES

[75] Inventors: Brent R. Blaes, Temple City; Martin G. Buehler, La Canada, both of Calif.

[73] Assignee: California Institute of Technology, Pasadena, Calif.

[21] Appl. No.: 829,772

[22] Filed: Feb. 18, 1986

[51] Int. Cl.⁴ .............................. G04F 8/00
[52] U.S. Cl. .................................. 368/120
[58] Field of Search ............... 368/113, 118–120; 324/73 R, 73 AT; 377/20; 364/569

[56] References Cited

U.S. PATENT DOCUMENTS

| | | | |
|---|---|---|---|
| 3,473,115 | 10/1969 | Oliver | 368/120 |
| 3,681,693 | 8/1972 | Hsueh | 368/120 |
| 3,896,378 | 7/1975 | Bedford | 368/120 |
| 4,164,648 | 8/1979 | Chu | 368/118 |
| 4,495,628 | 1/1985 | Zasio | 324/73 AT |

*Primary Examiner*—Vit W. Miska
*Attorney, Agent, or Firm*—Freilich, Hornbaker, Rosen & Fernandez

[57] ABSTRACT

Propagation delay of a signal through a channel is measured by cyclically generating a first step-wave signal for transmission through the channel to a two-input logic element and a second step-wave signal with a controlled delay to the second input terminal of the logic element. The logic element determines which signal is present first at its input terminals and stores a binary signal indicative of that determination for control of the delay of the second signal which is advanced or retarded for the next cycle until both the propagation delayed first step-wave signal and the control delayed step-wave signal are coincident. The propagation delay of the channel is then determined by measuring the time between the first and second step-wave signals out of the controlled step-wave signal generator.

15 Claims, 9 Drawing Figures

METHOD AND APPARATUS FOR CHARACTERIZING PROPAGATION DELAYS OF INTEGRATED CIRCUIT DEVICES

ORIGIN OF INVENTION

The invention described herein was made in the performance of work under a NASA contract, and is subject to the provisions of Public Law 96-517 (35 USC 202) in which the Contractor has elected to retain title.

BACKGROUND OF THE INVENTION

This invention relates to a method and apparatus for measuring propagation delays of integrated circuit devices. Such delay measurements are useful for integrated circuit manufacturing process characterization and qualification, and for designing large scale integrated circuits.

Very high speed large scale integrated circuit (IC) applications have revealed a definite need for assessing circuit and device parameters of importance for high speed digital circuit designs. The data obtained from high speed test circuits, in conjunction with validated circuit models, can help the IC designer make the proper decisions in achieving design goals. The problem is to obtain data that characterizes propagation delays through the stages (gates, inverters or the like) that are to be used in the digital circuit designs.

In the past, propagation delay measurements have been made using an integrated circuit ring oscillator having many stages, the operating frequency of which is determined as a measure of propagation delay through the stages. Dividing the oscillation period by twice the number of stages furnishes an average delay propagation through one stage. This method has certain disadvantages. Because propagation delays are inherently very short for each stage, a very large number of stages is required in order to have an easily measured oscillation period. Such a large number of stages requires too much space on an integrated circuit chip. A more serious problem is that the oscillator is subject to having spurious harmonic modes of oscillation. It is desirable to measure gate propagation delays directly, without having to use oscillations, and thus be free from effects caused by such feedback and coupling.

OBJECTS AND SUMMARY OF THE INVENTION

An object of the invention is to provide a method for measuring propagation delays of stages in an integrated circuit which does not rely upon a ring oscillator, and therefore requires less space on the chip, and which does not load the circuit under test.

These and other objects of the invention are achieved by a test circuit having a plurality of test channels, each comprised of a number of stages in cascade, such as inverters connected in series for propagation of a stepwave signal (low to high or high to low, whichever is selected). In one embodiment, the channels are connected to transmit a propagation delay test signal in parallel, and in another embodiment in series. In addition, series parallel arrangements may be provided for the channels with a multiplexer for selection of different channels for propagation delay measurements in the same manner as a single channel selected from a plurality of parallel channels. A step-wave test signal is applied, and after a known delay time a second step-wave signal is produced using a controlled timing waveform generator. The controlled delay of the second signal is adjusted until its delay is equal to the propagation time of the first signal through the selected parallel channel. That is accomplished by determining which occurs first, the delayed first signal out of a selected channel or the second signal out of the timing waveform generator, and adjusting the timing of the second signal until it occurs at the same time as the delayed first signal within the tolerance of the timing waveform generator. Either analog or digital techniques may be used for the necessary feedback control of the timing waveform generator. Once the adjustment is made, the time difference between the first signal out of the selected channel and the second signal out of the timing waveform generator is measured by a digital clock and stored as a measure of the propagation delay of the selected channel. A system controller may then select another channel using an addressable multiplexer.

To effectively compare the propagation delayed first signal of the channels with the second signal, a separate bistable logic element is connected to each channel with one input terminal A connected to the output of the associated channel, and the second input terminal B connected to receive the second signal. Both A and B input terminals must be high to produce a change in the signal of the logic element output. In a preferred embodiment, a two-input Muller C-element is employed as the logic element to compare the time of arrival of the first and second signals of either polarity, with means for selecting the polarity of the step-wave signals. The timing of the second signal is increased until A and B are both high (or low) at the same time, and then decreased until both A and B are no longer high (or low). Timing of the second signal is increased during each cycle until the second signal overlays the first signal and then alternately decreases and increases, each time by a smaller increment, until an output is produced from the logic element with the smallest possible increment of adjustment. The time interval between the generation of the first signal and the second signal is then measured with a counter connected directly to the source of the first and second signals. The channel under test is thus not loaded by the counter. The only load on the channel is the logic element which is provided as an integrated circuit having approximately the same loading factor as every stage in the channel under test. Thus, the bistable logic element is used as an "on chip" timing sampler to decide which of two signal transitions arrives at its input terminals first.

The novel features that are considered characteristic of this invention are set forth with particularity in the appended claims. The invention will best be understood from the following description when read in connection with the accompanying drawings.

BRIEF DESCRIPTION OF THE DRAWINGS

FIG. 4a is a circuit diagram of a Muller C-element shown in FIG. 2, and FIGS. 4b and 4c are waveform diagrams useful in understanding the operation of the element shown in FIG. 4a.

FIGS. 5a and 5b are waveform diagrams useful in understanding the operation of the system of FIG. 1 using the Muller C-element of FIG. 4a.

DESCRIPTION OF PREFERRED EMBODIMENTS

Figure 1:
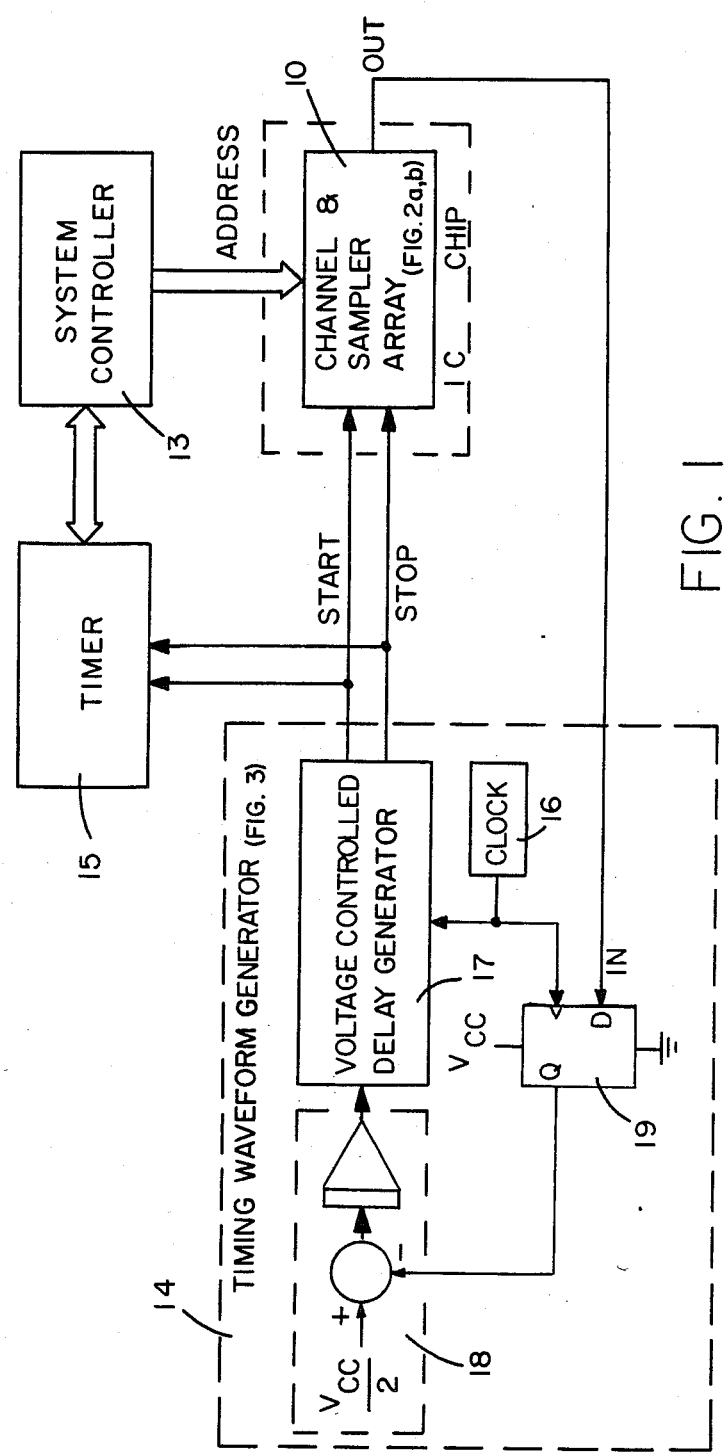
FIG. 1 is a block diagram illustrating the general organization of a preferred embodiment of the invention.
Figure 2A:
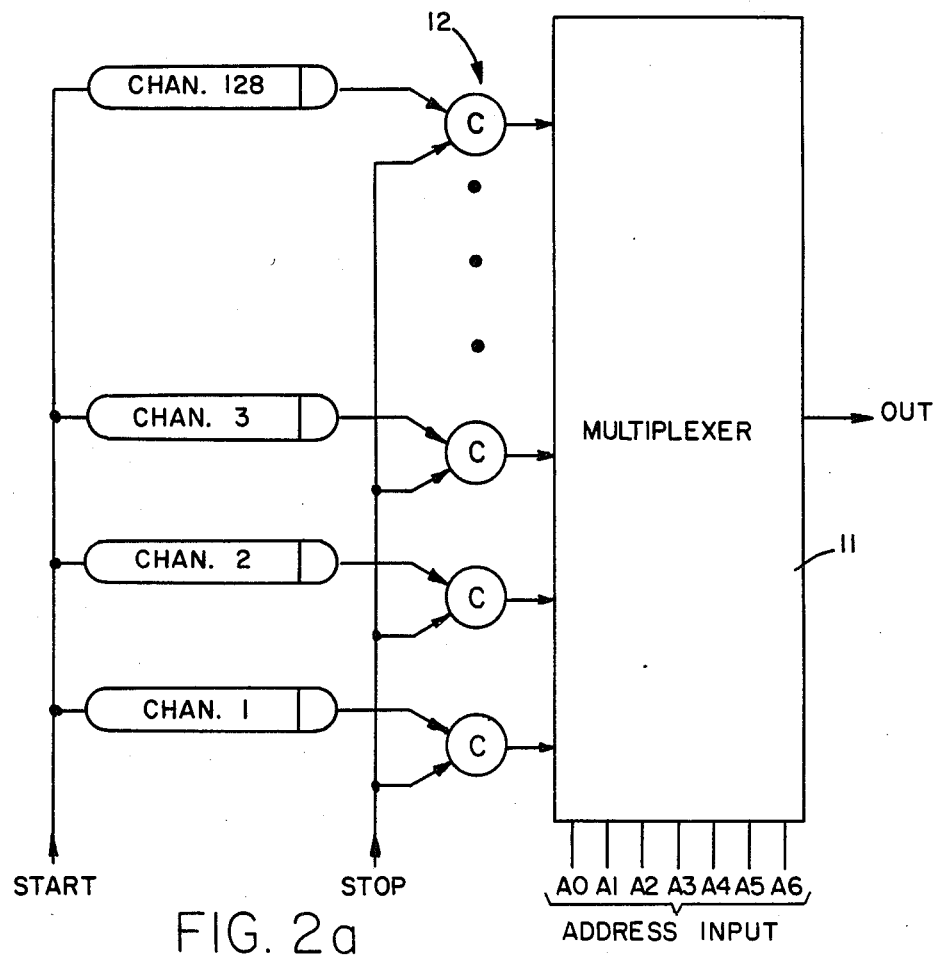
FIG. 2a is a block diagram of a first embodiment of a test channel and sampler array of FIG. 1.

Referring to the drawings, FIG. 1 discloses apparatus for measuring propagation delays through selected channels of an array 10 shown in FIG. 2a as having a plurality of delay channels 1-128 coupled to an output terminal by a multiplexer 11 and a plurality of bistable logic element samplers 12, such as a two-input Muller C-element, or equivalent, such as two cross coupled two-input NAND gates. (Each logic element is represented by the letter C in a circle.) These elements can change state only when one input is true, and the other undergoes a transition to true, or one input is false, and the other undergoes a transition to false, whichever is selected as the first and second test signals to be applied, namely positive or negative step-wave signals. A system controller 13, which may be implemented with a programmed digital computer, provides the address for selectively coupling out the Muller C-element associated with a respective one of the delay channels 1-128. For example, the controller may be programmed to address the delay channels in sequence.

Each delay channel in FIG. 2a consists of a number of stages in cascade, such as CMOS inverters connected in cascade for propagation of a positive, or negative, step signal. In practice, all of a selected group of channels will have the same number of stages, such as 40, but may have different parameters in the construction of its stages, e.g., length and width, or some other parameter, such as loading at each stage by fan out to one or more other stages not in the chain. The channel and sampler array 10 is produced as an integrated circuit for the purpose of obtaining propagation delay measurements which can be used for characterization of the IC inverters as a function of the parameters when purposely made different from one channel to the next in order to provide a circuit designer with a wide spread of data. One group of the channels, such as channels 1-8, may be merely deposited metal traces to provide a baseline for the propagation delay measurement. The baseline propagation delay is then subtracted from measured propagation delays of the channels.

The inputs of all 128 channels are connected to a common START terminal and the output of each channel is connected to a separate two-input logic element. The second input of each logic element is connected to a common STOP terminal. A step-wave signal applied to the STOP terminal is adjusted in time with respect to the step-wave signal applied to the START terminal by a timing waveform generator 14 until its step (edge of transition from low to high, or high to low) is caused to be in substantial coincidence with the step of the propagation delayed START signal. At that time, the output of a timer 15, which counts very high frequency (100 MGHz) clock pulses, indicates the propagation delay of the channel. As will be noted more fully hereinafter, propagation delay measurements are made over many cycles for each channel and then averaged to increase the accuracy and resolution of the measurement.

Figure 2B:
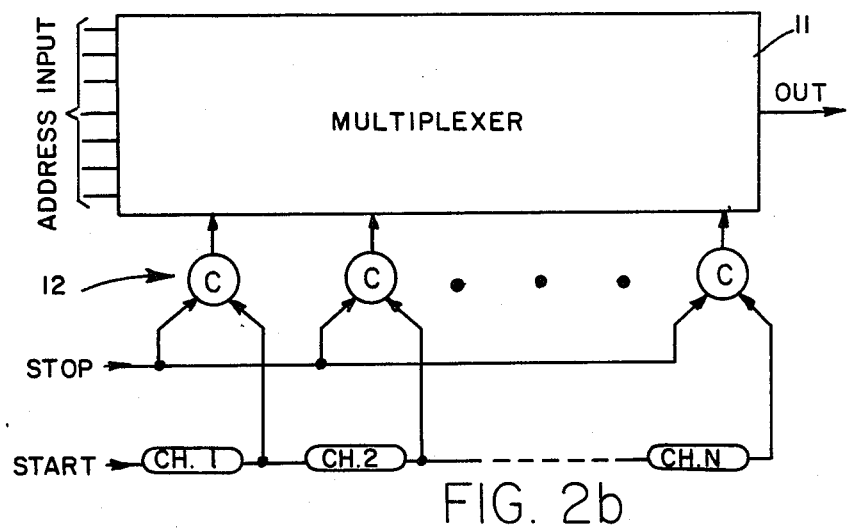
FIG. 2b is a block diagram of a second embodiment of a test channel and sampler array.

FIG. 2b illustrates an alternative embodiment of the channel and sampler array 10 of FIG. 1. The basic difference is that the channels, each of which may be comprised of a plurality of cascaded stages, are connected in series so that the START signal propagates through the channels in sequence rather than in parallel. The output of each channel is connected to a Muller C-element as in the first embodiment of FIG. 2a, and each Muller C-element is connected to receive the STOP signal.

This embodiment of FIG. 2b lends itself to being implemented on every integrated circuit produced from a wafer in order to be able to test the propagation delay characteristics of the channels on the chip, and thus determine the propagation delay characteristics of circuits on the chip, such as microprocessor circuits. However, the embodiment of FIG. 2a could also be used in this way, as well as in a way suggested hereinbefore, to obtain design data.

Figure 3:
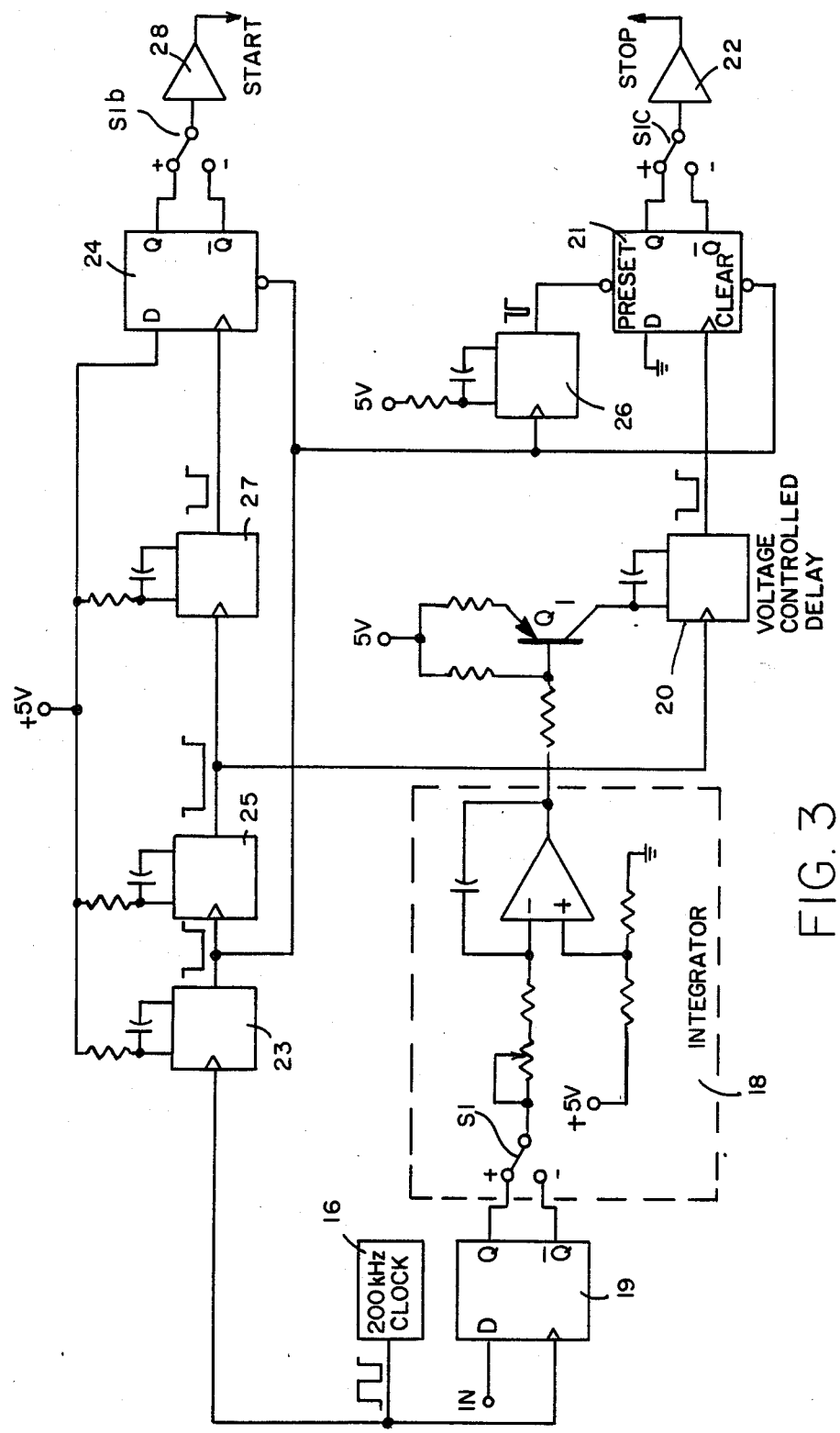
FIG. 3 is a more detailed schematic diagram of the timing waveform generator of FIG. 1.

As will be described more fully with reference to FIG. 3, a low frequency (200 kHz) clock pulse generator 16 periodically initiates a cycle of the timing waveform generator. For each cycle, the delay between the START and STOP transitions are adjusted until the channel and sampler array 10 produces an output indicative of delay time coincidence. At that time, the output of the sampler, (Muller C-element) changes state from high to low, or vice versa, and stores the information implied by the transition as to which signal arrived first until the next cycle of the timing waveform generator. The next cycle clock triggers a D-type flip-flop 19 to change its state. That causes the integrator 18 to ramp down for shorter time delays of the STOP pulse relative to a START pulse generated with each subsequent cycle clock, until time delay coincidence is again sensed, at which time the flip-flop 19 will again change state. The result is that the time delay of the STOP is increased from cycle to cycle until it exceeds the propagation delay of the START signal, and is then alternately decreased and increased from cycle to cycle. The feedback loop will quickly lock the time delay of the STOP signal onto the propagation delay of the START signal and stablize with the flip-flop 19 changing state every clock cycle. After allowing the closed loop to stabilize, the system controller will cause the timer 15 to measure the time between the STOP signal each START signal over many cycles (typically $10^5$). The controller then averages the measurements and stores the time delay for that channel as it selects another channel through the multiplexer 11 (FIG. 2a). The averaging may be made in the timer 15 in order to simplify the task of the controller, such as by using a Tektronix 5009 counter/timer which counts clock pulses (100 MHz) from an internal clock.

Instead of programming the controller to allow a predetermined time to stabilize for each channel, it would be possible to provide logic connected to the flip-flop 19 and clock source 16 to sense when the flip-flop 19 changes state during two successive clock cycles as an indication that stabilization has been reached. At that time, the next $10^5$ cycles may be used for propagation delay measurements before selecting another channel. However, for channels having 40 stages (e.g., inverters) in series, the approximate propagation delay is known, and the maximum deviation from that can be estimated. Consequently, the maximum time to ramp the time delay from one extreme to the other can be calculated and used as the time for the controller to allow for stabilization.

The timing waveform generator will now be described in more detail with reference to FIG. 3. Switches S1a, b and c are shown in a position for selecting as the mode of operation the measurement of propagation delays for positive step waveform. With the switches in their alternate state, the mode of operation is for negative step voltages. Operation in the alternate mode will be readily understood from a description of the first mode, since they are the same except as to polarity, but the ability to select positive and negative modes is important because the propagation delay may not be equal for both positive and negative transitions of a propagated signal.

Flip-flop 19 receives the output signal of the channel and sampler array 10. That output signal will be alternately high and low for each waveform generating cycle. Assuming it is high, the next cycle clock will set the flip-flop in its one state with Q high to cause the integrator 18 to ramp up. This output ramp controls a voltage controlled monostable multivibrator 20 to decrease the timing delay. When the flip-flop 19 is reversed in state by the input signal to initiate another timing cycle, the Q output will go low to cause the output of the integrator to go low. This alternately rising and falling ramp signal will cause the STOP signal timing to be alternately decreased and increased by operation control of a voltage controlled delay multivibrator 20 via a transistor $Q_1$ used as a voltage controlled current source which triggers a D-type flip-flop to its zero state with Q low. A noninverting driver 22 feeds the STOP signal to the channel and sampler array 10.

Each clock pulse from the clock generator 16 triggers a reset monostable multivibrator 23 which clears the flip-flop 21 and a flip-flop 24. This places both flip-flops in the zero state. At the trailing edge of the reset pulse, a monostable multivibrator 25 is triggered to produce an "arm" signal. The trailing edge of the reset signal also triggers a monostable multivibrator 26 which produces a short pulse for presetting the flip-flop 21 to the one state which, through the noninverting driver 22, produces a high STOP signal.

The trailing edge of the arm signal also triggers the voltage controlled delay monostable multivibrator 20 and a monostable multivibrator 27 which produces a predetermined time delay before the START signal is initiated. This provides for an offset in the START signal so that it will be possible to control the STOP signal down to zero propagation delay measurements. Note that in this implementation it is the trailing edge of the STOP signal that is adjusted in time until it coincides with the leading edge of a START signal that has been delayed in propagation through the channel. When the monostable multivibrator 20 times out, its trailing edge triggers the flip-flop 21, thus causing the STOP signal to terminate (i.e., causing a step transition in the STOP signal). In the meantime, the START signal has been initiated on the trailing edge of the pulse from the monostable multivibrator 27 by triggering the flip-flop 24 to its one state. A noninverting driver 28 transmits the START signal to the channel array.

Figure 4C:
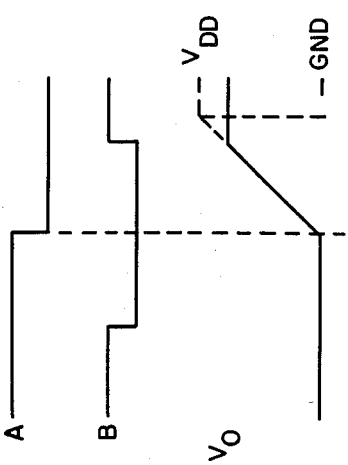
Figure 4B:
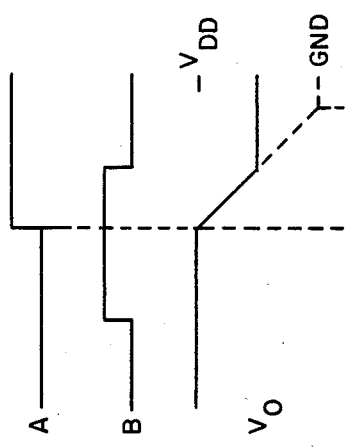
Figure 4A:
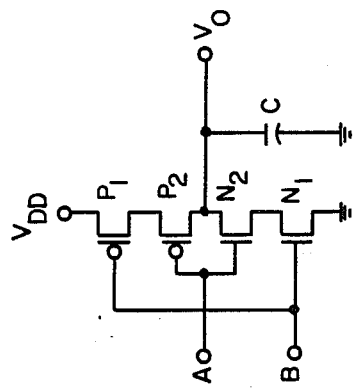

Before discussing the circuit of FIG. 3 further in respect to the feedback from the output of the channel and sampler array 10 to the input of the flip-flop 19, the organization and operation of the Muller C-elements will be described with reference to FIGS. 4a, b and c. A Muller C-element is comprised of a CMOS inverter having two N-channel transistors $N_1$ and $N_2$ and two P-channel transistors $P_1$ and $P_2$. The channel delayed START signal is applied to the A terminal connected to the gates of transistors $N_2$ and $P_2$, and the STOP signal is applied to the B terminal connected to the gates of transistors $N_1$ and $P_1$. While both A and B are low, both transistors $P_1$ and $P_2$ are on, and $V_0 = V_{DD}$. When A is low and B is high, no transistor will conduct, and the capacitor C is isolated from ground $V_{DD}$. Consequently, the output $V_0$ remains at the level to which the capacitor C is charged. When A also becomes high, transistors $N_1$ and $N_2$ will be turned on to discharge the capacitor towards ground, as shown in FIG. 4b. If A is the start signal delayed through a channel, and B is the STOP signal, this represents the controlled delay of the STOP signal being greater than the propagation delay of the channel. This C-element $V_0$ is the feedback signal which changes the state of the flip-flop 19 on the next cycle clock pulse to cause the STOP delay to be decreased until its trailing edge occurs too early. The flip-flop 19 is then reversed and the STOP delay is increased. This alternating between lengthening and shortening the time delay of the STOP signal (i.e., the termination of the STOP signal in this embodiment) will continue until the trailing edge of the propagation delayed START signal at terminal A coincides with the trailing edge of the STOP signal at the terminal B.

As shown in FIGS. 4b and c, the next STOP signal occurs so soon after the output signal $V_0$ begins to change that it does not completely discharge to ground in one case, or completely charge to $V_{DD}$ in another case, but the charge or discharge level will be sufficient to determine whether the output should be a 1 or a 0 through design of an input amplifier of the multiplexer. In either embodiment, an amplifier with positive feedback at the output of the Muller C-element may be included to staticize the level of the OUT signal fed back to the flip-flop 19 as a 1 or a 0 level. This illustrates the principles of operation of the Muller C-elements. Its operation in the present invention will now be described more fully with reference to FIGS. 5a and b.

Figure 5B:
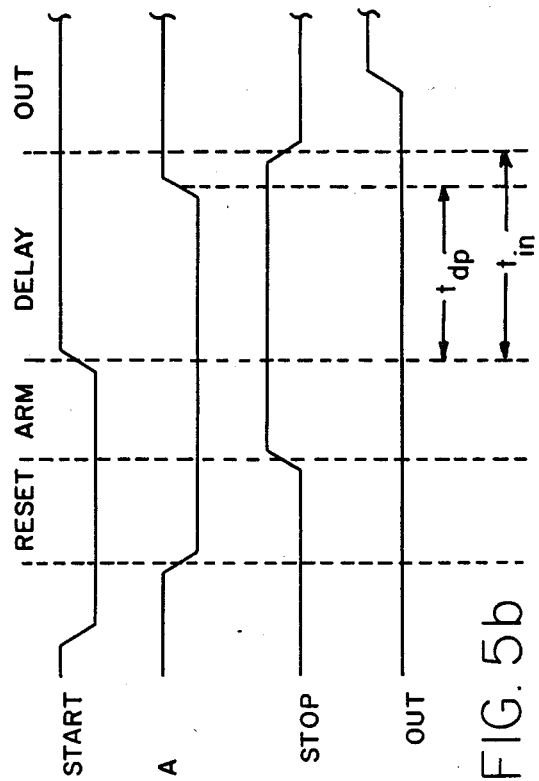
Figure 5A:
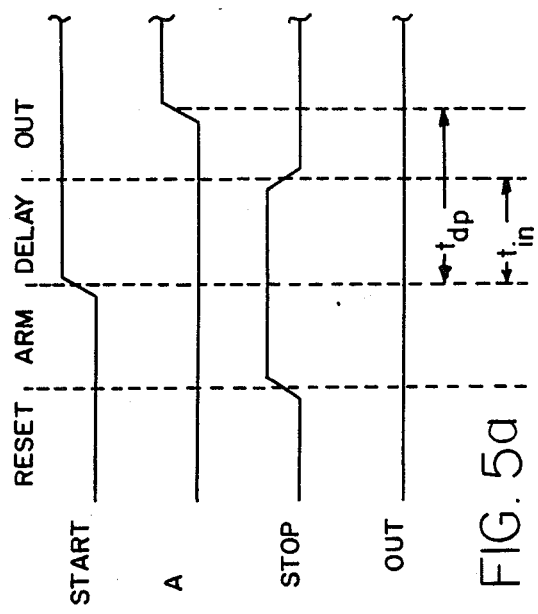

In FIG. 5a, a START signal is shown initiated after the reset monostable multivibrator 23 and arm monostable multivibrator 25 have timed out. After a time delay $t_{dp}$ due to propagation through a channel, the START pulse emerges as a signal A. When the reset monostable multivibrator has timed out to clear the flip-flop 21, the monostable multivibrator 26 times out and presets the flip-flop 21 to the one state.

Once the voltage controlled delay monostable multivibrator 20 has timed out, the trailing edge of its output signal triggers the flip-flop 21 to its zero state (Q low). Note that the STOP signal always begins at the end of the reset time upon the start delay monostable multivibrator 20 timing out. And finally, note the START signal is always delayed by the short period of the multivibrator 27 which is part of the arm period. That time is so short that is not shown in FIGS. 5a and b.

When the monostable multivibrator 20 times out to reset the flip-flop 21, the STOP signal drops, but the Muller C-element of the selected channel does not produce an OUT signal. The STOP signal is the B input shown in FIG. 4a. When both the A and B are low, transistors $P_1$ and $P_2$ are on to charge the capacitor C, so the Muller C-element is high during the first part of every cycle. When B goes high during the arm period, transistors $P_1$ and $N_2$ are off, so the capacitor remains charged until such time as both A and B are high, which occurs only if the STOP signal overlaps the propagation delayed START signal, i.e., the A signal as shown in FIG. 5b. The OUT signal is fed directly back as the IN signal to the flip-flop 19 to enable it to be triggered to its alternate state upon the occurrence of the next clock pulse. That will cause the integrator to start ramping down, and thus decrease the timing of the STOP signal. As the STOP signal timing is decreased, it will reach a point where there is no overlap between it and the A signal, and the flip-flop 19 will be reset by the next clock pulse. This will cause the integrator to again ramp up to increase the STOP signal timing. The integrator will thus be caused to alternately ramp up and down at shorter and shorter intervals, until it alternates with every clock pulse. The STOP signal timing is then said to be locked on the propagation delay $t_{dp}$ which is measured by timing the period between the START signal and the end of the STOP signal.

The locked in condition is theoretically the condition where the time delay controlled by the integrator, shown as $t_{in}$ in FIGS. 5a and b, is equal to the channel propagation delay $t_{dp}$ plus or minus some small difference. However, owing to the fact that the leading and trailing edges of the START and STOP signals slope, and to the fact that the capacitor of the Muller C-element does not always fully charge and discharge, there is some uncertainty in the measured propagation delay. To reduce that uncertainty, the propagation delay $t_{dp}$ is measured over many cycles after lock in, typically $10^5$ cycles, and the average is then taken as the precise measurement. The averaging procedure will also eliminate any measurement error that may be inherent in the operation of that timer.

Although a particular embodiment has been disclosed using largely analog techniques for the timing waveform generator, it should be recognized that in the broadest aspects of the invention, the timing waveform generator could be implemented with digital techniques, where the OUT signal is used to increment the STOP signal timing, and the absence of an OUT signal is used to decrement the STOP signal timing by incrementing and decrementing a binary register, and using a clock counter to time the STOP signal until the counter equals the binary content of the register. In order to lock in rapidly, the binary number used to increment and decrement the register may itself be made smaller by a binary search algorithm for each cycle until that number is reduced to one. Such a digital technique could be made sufficiently precise to obviate the need for averaging, and in fact the content of the register after lock-in may be taken as the measure of $t_{dp}$ if the least significant bit of the control is sufficiently small. The propagation delay data obtained for channels of different design parameters can be very helpful to IC designers, in conjunction with validated circuit models, to make proper decisions in selecting integrated circuit design parameters, such as load, length and width of transistor geometries in very large scale IC application. The propagation delay data may also be used to evaluate the characteristics of circuits on an integrated circuit chip. If the channels are provided as a separate test circuit on the chip, it can be inferred that the functional circuit in the chip has the same propagation delay characteristics. But it would be possible to adapt the present method to measure the propagation delay of selected channels in the functional circuit directly by incorporating in the integrated circuit the ability to apply the START and STOP pulses and detect coincidence at appropriate points in the circuit. Yet other modifications and equivalents will occur to those skilled in the art. Consequently, the scope of the claims is intended to cover such modifications and equivalents.

What is claimed is:

1. A method for measuring propagation delays of channels in integrated circuits on a semiconductor chip comprising the steps of
    providing as integrated circuits on said semiconductor chip an array of two-input logic elements, one logic element for each channel having one input terminal connected to the output of its associated channel with minimum loading of the channel, and each logic element having an output terminal coupled to an array output terminal, a connection from a first system input terminal to an input terminal of said channels, and a connection from a second system input terminal to the second input terminal of each logic element in common,
    cyclically applying a first signal to said first system input terminal,
    cyclically applying a second signal to said second system input terminal with a controlled time delay,
    observing the output of a selected logic element to determine which of said first signal, delayed by an associated channel, and said second signal occurs first during each cycle,
    increasing the controlled time delay of the second signal if it occurs first, and decreasing the controlled time delay of the second signal if it occurs last during each cycle, and
    measuring the period between the time said first signal is applied and the time said second signal is applied as a measure of channel propagation time delay.

2. A method as defined in claim 1 wherein the step of measuring the period between the time said first signal is applied and the time said second signal is applied is carried out by counting clock pulses over a plurality of cycles of said first and second signals, and averaging the results.

3. A method as defined in claim 1 wherein said channels are connected in series, each one being connected to a preceding one, and the first one connected to said first system input terminal, and said array includes a multiplexer for coupling the output of a selected logic element to said array output terminal.

4. A method as defined in claim 1 wherein said channels have their input terminals connected to said first system input terminal in common, and said sampler array includes a multiplexer for coupling the output of a selected logic element to said array output terminal.

5. A method as defined in claim 4 wherein said first and second signals are step-wave signals, and observation of which of said first and second step-wave signals occurs first is made by two-input logic elements, one for each channel receiving a channel delayed first signal and said second signal.

6. A method as defined in claim 5 wherein said two-input logic element determines during each cycle when both logic signals are low and produces a low output signal until it determines both signals are high to produce a high output signal for positive step-wave first and second signals, and vice versa for negative step-wave first and second signals, and said output signal level from each cycle is stored until the next cycle.

7. A method for characterizing propagation delays of active elements in integrated circuits comprising the steps of
    producing an array of integrated circuit channels, each with a plurality of active elements connected in cascade together with an addressable multiplexer and a plurality of two-input logic elements, said active elements in a channel having the same parameters, with active elements in different channels having different parameters, one logic element for each channel having one input terminal connected to the output of its associated channel and having an output terminal connected to said multiplexer for selective coupling of said logic elements to an output of said multiplexer, a connection from a first system input terminal to an input terminal of all channels in common, and a connection from a second system input terminal to the second input terminal of each logic element in common, cyclically applying a first signal to said first system input terminal, cyclically applying a second signal to said second system input terminal with a controlled time delay, determining which of said first signal delayed by a selected channel and said second signal occurs first during each cycle, increasing the controlled time delay of the second signal if it occurs first, and decreasing the controlled time delay of the second signal if it occurs last during each cycle, determining the period between the time said first signal is applied and the time said second signal is applied as a measure of propagation time delay through a plurality of active elements, and repeating the procedure for all channels of said array, whereby the propagation delay of active elements of different parameters is determined by dividing the propagation delay of each channel by the number of active elements in each channel.

8. A method as defined in claim 7 wherein at least one additional channel is provided in said array comprised of a conductive metal trace for use in measuring propagation delay through metal traces in integrated circuits, whereby a baseline for propagation delay measurements of channels having active elements is determined by measuring the propagation delay of said additional channel, and having determined said baseline, subtracting said baseline from the measured propagation delay of said plurality of channels before dividing by the number of active elements in said channels to determine the propagation delay of active elements in said channels having different design parameters.

9. Apparatus for measuring propagation delays of channels in integrated circuits on a semiconductor chip comprising an integrated circuit sampler array on said chip, said sampler array comprising a plurality of two-input logic elements, one logic element for each channel having one input terminal connected to the output of its associated channel and having an output terminal coupled to an array output terminal, a connection from a first system input terminal to an input terminal of said channels, and a connection from a second system input terminal to the second input terminal of each logic element in common, a timing waveform generator off said chip for cyclically producing first and second step-wave signals with controlled delay of said second signal relative to the first signal, means for applying said first signal from said generator to said first system input terminal, means for applying said second signal to said second system input terminal, means comprised of said two-input logic elements for determining which of said first signal propagated through a selected channel and said second signal occurs first during each cycle of said generator, means for increasing the controlled time delay of the second signal if it occurs first, and decreasing the controlled time delay of the second signal if it occurs last during each cycle, and means off of said chip connected to said timing waveform generator for measuring the period between the time said first signal is applied and the time said second signal is applied to said integrated circuit sampler array as a measure of channel propagation time delay.

10. Apparatus as defined in claim 9 wherein said channels are connected in series, each one being connected to a preceding one, and the first one connected to said first system input terminal, and said integrated circuit sampler array includes a multiplexer for coupling the output of a selected logic element to said array output terminal.

11. Apparatus as defined in claim 9 wherein said channels have their input terminals connected to said first system input terminal in common, and said integrated circuit sampler array includes a multiplexer for coupling the output of a selected logic element to said array output terminal.

12. Apparatus as defined in claim 10 or 11 wherein said two-input logic element includes means for storing its output signal during each cycle until the next cycle, and said waveform generator includes means for reading out the stored signal of a selected two-input logic element at the beginning of each cycle, and storing the signal thus read during the next cycle for control of the increase or decrease of the time delay of said second signal.

13. Apparatus as defined in claim 12 wherein each two-input logic element is comprised of a two-input Muller C-element.

14. Apparatus for characterizing propagation delays of active elements in integrated circuits comprising an array of integrated circuit channels on a semiconductor chip, each with a plurality of active elements connected in cascade together with an addressable multiplexer on said chip and a plurality of two-input logic elements on said chip, said active elements in a channel having the same parameters, with active elements in different channels having different parameters, one logic element for each channel on said chip having one input terminal connected to the output of its associated channel and having an output terminal on said chip connected to said multiplexer, whereby selective coupling of said logic elements to said output terminal by said multiplexer is made, a connection from a first system input terminal on said chip to an input terminal on said chip of all channels in common, and a connection from a second system input terminal on said chip to the second input terminal of each logic element in common on said chip, means for cyclically generating first and second step-wave signals with a controlled time delay of said second signal, means for applying said first signal from said generating means to said first system input terminal, means for applying said second signal from said generating means to said second system input terminal, means comprised of said two-input logic elements for determining on chip which of said first signal delayed by propagation through a selected channel and said second signal occurs first during each cycle, means for increasing the controlled time delay of the second signal in said generating means if it occurs first, and decreasing the controlled time delay of the second signal in said generating means if it occurs last during each cycle, means connected directly to said signal generating means for measuring the period between the time said first signal is applied and the time said second signal is applied as a measure of propagation time delay through a plurality of active elements.

15. Apparatus as defined in claim 14 wherein at least one additional channel is provided in said array comprised of a conductive metal trace deposited as part of said integrated circuit, whereby a baseline for propagation delay measurements of an integrated circuit may be determined by measuring the propagation delay of said additional channel.

* * * * *